United States Patent
Wu et al.

(10) Patent No.: US 8,648,262 B2
(45) Date of Patent: Feb. 11, 2014

(54) EMBEDDED MULTI-LAYER CIRCUIT BOARD AND NOISE SUPPRESSION METHOD

(75) Inventors: Tzong-Lin Wu, Taipei (TW); Chung-Hsiang Huang, Taipei (TW)

(73) Assignee: National Taiwan University, Taipei (TW)

( * ) Notice: Subject to any disclaimer, the term of this patent is extended or adjusted under 35 U.S.C. 154(b) by 203 days.

(21) Appl. No.: 13/045,695

(22) Filed: Mar. 11, 2011

(65) Prior Publication Data
US 2012/0048611 A1     Mar. 1, 2012

(30) Foreign Application Priority Data

Aug. 27, 2010 (TW) .............................. 99128789 A (51) Int. Cl.
*H05K 1/11* (2006.01)
*H05K 1/02* (2006.01)

(52) U.S. Cl.
CPC .................................. *H05K 1/0236* (2013.01)
USPC .......................................... 174/261; 174/255

(58) Field of Classification Search
CPC .................. H05K 1/0236; H05K 2201/09309
USPC ........... 174/260, 262, 255; 333/246, 247, 33, 333/181, 185; 361/760–764, 780, 794, 795; 29/852
See application file for complete search history.

(56) References Cited

U.S. PATENT DOCUMENTS

| | | | |
|---|---|---|---|
| 2005/0168238 A1* | 8/2005 | Wu et al. ........................ | 326/27 |
| 2005/0205292 A1* | 9/2005 | Rogers et al. ................. | 174/255 |
| 2007/0090398 A1* | 4/2007 | McKinzie, III ............... | 257/192 |
| 2009/0133913 A1* | 5/2009 | Kushta et al. ................. | 174/260 |
| 2010/0252319 A1* | 10/2010 | Cho et al. ...................... | 174/377 |
| 2011/0297432 A1* | 12/2011 | Xie ................................ | 174/262 |

* cited by examiner

*Primary Examiner* — Yuriy Semenenko
(74) *Attorney, Agent, or Firm* — Morris Manning & Martin LLP; Tim Tingkang Xia, Esq.

(57) ABSTRACT

The invention relates to an embedded multi-layer circuit board and a noise suppression method. The embedded multi-layer circuit board comprises at least two ground layers, a power layer and a plurality of vias. The power layer is between two ground layers. Each via is electrically connected with the two ground layers and electrically isolated from the power layer. The power layer is divided to a plurality of periodical cells. Each cell comprises the same number of the vias.

19 Claims, 11 Drawing Sheets

Table 1
The normalized cutoff frequency of the modes between ground plates obtained from the analytic solution

| r/a | $f_n(r/a)$ | r/a | $f_n(r/a)$ |
|---|---|---|---|
| 0.010 | 0.445 | 0.110 | 0.783 |
| 0.020 | 0.496 | 0.120 | 0.813 |
| 0.030 | 0.536 | 0.130 | 0.843 |
| 0.040 | 0.571 | 0.140 | 0.873 |
| 0.050 | 0.604 | 0.150 | 0.905 |
| 0.060 | 0.635 | 0.160 | 0.937 |
| 0.070 | 0.665 | 0.170 | 0.972 |
| 0.080 | 0.695 | 0.180 | 1.006 |
| 0.090 | 0.724 | 0.190 | 1.037 |
| 0.100 | 0.753 | 0.200 | 1.074 |

EMBEDDED MULTI-LAYER CIRCUIT BOARD AND NOISE SUPPRESSION METHOD

CROSS-REFERENCE TO RELATED APPLICATION

This non-provisional application claims priority under 35 U.S.C. §119(a) on Patent Application No. 099128789 filed in Taiwan, R.O.C. on Aug. 27, 2010, the entire contents of which are hereby incorporated by reference.

BACKGROUND OF THE INVENTION

1. Field of the Invention

The present invention relates to an embedded multi-layer circuit board and a noise suppression method, and particularly to an embedded multi-layer circuit board and a noise suppression method employing a periodical structure.

2. Description of the Prior Art

With the rapid development of modern technologies, the operating speed of the digital circuit and clock frequency become higher and higher, and the composition of the analog circuit is getting more complicated, and the frequency bands with which the RF (Radio frequency) circuit operates are increased. Moreover, the current trend is to make the whole printed circuit board smaller, and even develops toward the compact system package. Thus, a plurality of transmission wires for transmitting different signals will be integrated into a tiny space. Since most of the signals exist between the ground boards in the multi-layer circuit board, the transmission mode between the ground boards will cause the coupling noise. For example, when a signal is transmitting on a transmission wire, a part of the energy will be coupled with the transmission mode between the ground boards, and a part of these modes will be coupled with another transmission wire, and the other part will travel to the edge of the ground board; then the energy will be radiated to the external space. Since a plurality of chips share the same power layer, the resonance of the power layer will be activated when the operating frequency of the chip exceeds the resonance frequency of the power layer, and thereby the power layers originally being of equal potential become the power layers with greatly fluctuated potentials, such that the chip may not be operable normally, or may even not operable.

There are many methods for suppressing the coupling noise, but most of them are used in the case that only one side has a ground plane. Although the same methods can be applied to the embedded circuit, the effect is not significant. As for the noise suppression in the power layer, the commonest method is using the decoupled capacitor. The decoupled capacitor may provide the path of short-circuit under natural frequency of vibration, so as to suppress the resonance mode of the power layer. However, due to the limitation of parasitic inductance, it is difficult to raise the natural frequency of vibration. Another method is using a periodical structure. The periodical structure can produce the electromagnetic bandgap to suppress the transmission mode of the power layer. The structures may be divided into two types according to their profiles. The first type is a mushroom-shaped structure, which has the defect that the bandwidth of the electromagnetic bandgap is not large, and it requires an additional space of two layers to be applied in the embedded power layer. The second type is a plane structure. Although such structure provides larger bandwidth of the electromagnetic bandgap, it cannot produce the electromagnetic bandgap if directly applied in the embedded power layer.

Therefore, there is a pressing need for an embedded multi-layer circuit board and a noise suppression method employing plane-type periodical structure, in which the mode between ground boards can be transmitted without an electromagnetic bandgap.

SUMMARY OF INVENTION

The present invention provides an embedded multi-layer circuit board, which comprises at least two ground layers, one power layer, and a plurality of vias. The power layer is located between the two ground layers. Each via is electrically connected with the two ground layers, and each via is electrically isolated from the power layer. The power layer is divided into a plurality of periodical cells, and each periodical cell has the same number of the vias.

Preferably, the embedded multi-layer circuit board according to the present invention further comprises at least one circuit layer.

Preferably, the sums of areas occupied by the vias in each periodical cell on the power layer are equal.

Preferably, each periodical cell has a rectangular profile.

Preferably, the power layer comprises a plurality of metal plates. Each metal plate is electrically connected with each other, and individually corresponds to one periodical cell.

Preferably, the metal plate is electrically isolated from the vias.

Preferably, the power layer comprises a plurality of metal plates, and each metal plate is electrically connected with each other and has the same profile.

Preferably, there is a bandwidth for noise suppression between the power layer and the ground layer.

Preferably, there is a bandwidth for noise suppression between the two ground layers.

Preferably, the number of the vias in each periodical cell does not exceed four.

Preferably, each periodical cell has a square profile.

Preferably, each square profile has at least one via located in the center of the square profile.

Preferably, each square profile has a via, and the via is located in the center of the square profile.

Preferably, each square profile has at least two vias, and one of the vias is located in the center of the square profile, and the equivalent portions of the other vias are distributed radially and symmetrically with respect to the center of the square profile.

Preferably, each square profile has four vias, and the four vias are distributed radially and symmetrically with respect to the center of the square profile.

Preferably, the power layer comprises a first power plate and a second power plate, and the first power plate and the second power plate are electrically isolated from each other.

Preferably, the first power plate and the second power plate are used to be connected with different voltage potentials.

Preferably, the first power plate comprises a plurality of metal plates, and each metal plate is electrically connected with each other, and individually corresponds to one periodical cell.

The present invention provides another noise suppression method for multi-layer circuit board. The multi-layer circuit board comprises at least two ground layers and one power layer. The power layer is located between the two ground layers. The method includes: dividing the power layer into a plurality of periodical cells; providing the same number of the vias in each periodical cell; electrically connecting each via with the two ground layers; and electrically isolating each via from the power layer.

Preferably, the noise suppression method for multi-layer circuit board according to the present invention further comprises: forming a plurality of metal plates on the power layer, and each metal plate is electrically connected with each other, and individually corresponds to one periodical cell.

Preferably, the noise suppression method for multi-layer circuit board according to the present invention further comprises: configuring the vias in each periodical cell, such that the sums of areas occupied by the vias in each periodical cell are equal.

Preferably, the noise suppression method for multi-layer circuit board according to the present invention further comprises: providing each periodical cell with a square profile, and the equivalent areas of the vias being distributed radially and configured symmetrically with respect to the center of the square profile.

In a summary, the embedded multi-layer circuit board and the noise suppression method according to the present invention employ the vias between ground layers to suppress all the coupling signals between ground layers.

DETAILED DESCRIPTION OF PREFERRED EMBODIMENTS

Figure 1:
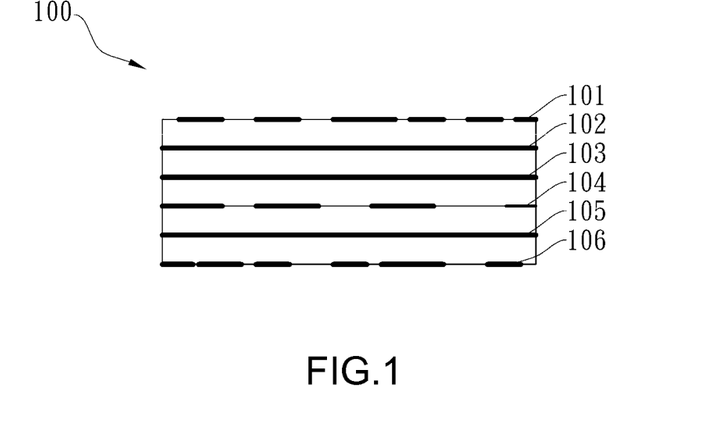
FIG. 1 is the diagram illustrating a basic structure of the embedded multi-layer circuit board according to the present invention.

Referring to FIG. 1, it illustrates a basic structure of the embedded multi-layer circuit board according to the present invention. The embedded multi-layer circuit board 100 comprises three circuit layers 101, 104 and 106, two ground layers 102, 105, and one power layer 103. The power layer 103 is located between the two ground layers 102 and 105; thereby the embedded circuit is formed. The present invention is illustrated with six-layer circuit board, but those skilled in the art will appreciate that the present invention can be applied to multi-layer embedded circuit boards having different numbers of layers. Besides, because the embedded multi-layer circuit board according to the present invention may be applied to the multi-layer structure, the power layer 103 and the ground layers 102, 105 may be formed on different substrates, respectively.

Figure 2:
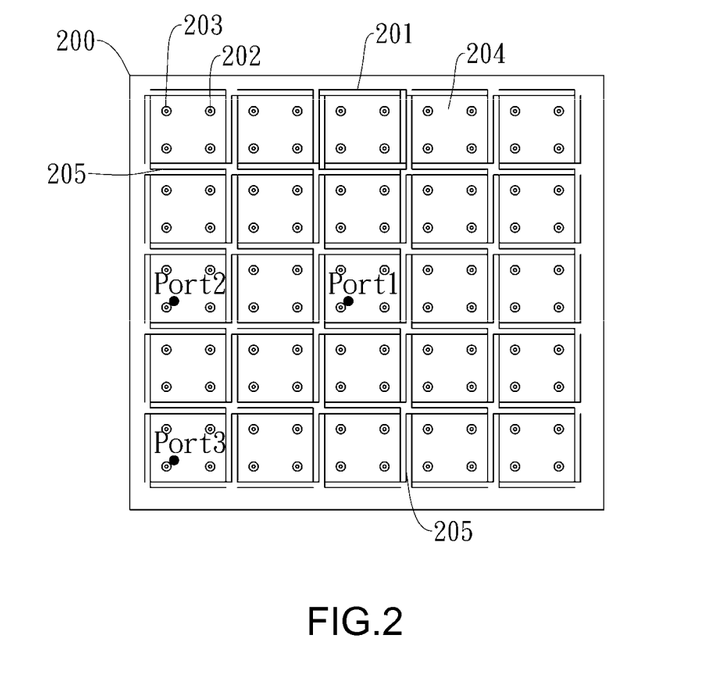
FIG. 2 is a diagram of the first embodiment of the embedded circuit board according to the present invention.

Referring to FIG. 2, it is a diagram of the first embodiment of the embedded circuit board according to the present invention. The power layer 200 comprises a plurality of periodical cells 201, and each periodical cell 201 has the same number of vias 202. Each periodical cell 201 comprises a metal plate 204, and each metal plate 204 is electrically connected with each other, and has the same profile. Each metal plate 204 is spaced apart from one another in a distance, and the metal plates are interconnected by a plurality of bridges 205. Please refer to R.O.C. Patent Publication No. 200623974 regarding the relative configuration of metal plates 204 and bridges 205. Generally, the periodical cell 201 has a rectangular profile, preferably has a square profile. However, a non-rectangular profile can also be applied to the present invention, for example, a triangular profile or a hexagonal profile.

Figure 3:
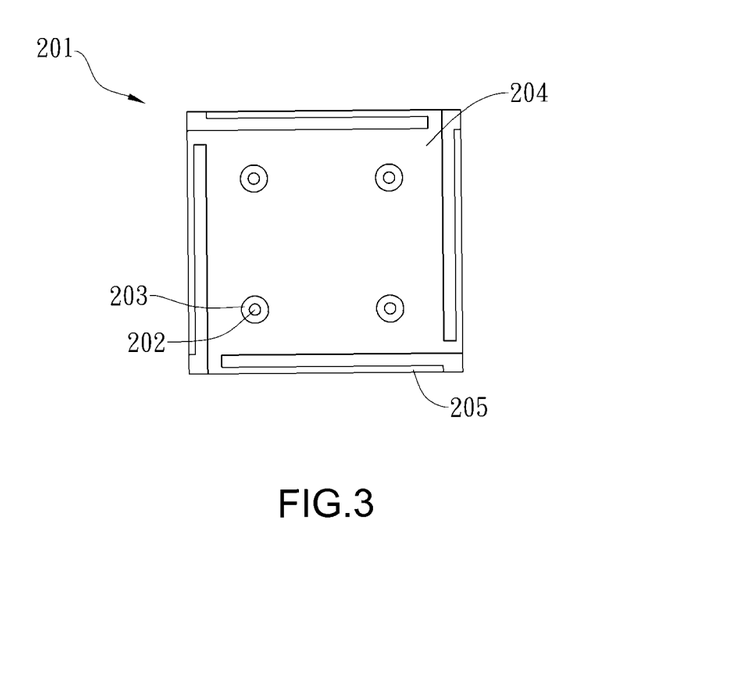
FIG. 3 is an enlarged diagram of the periodical cell.
Figure 4:
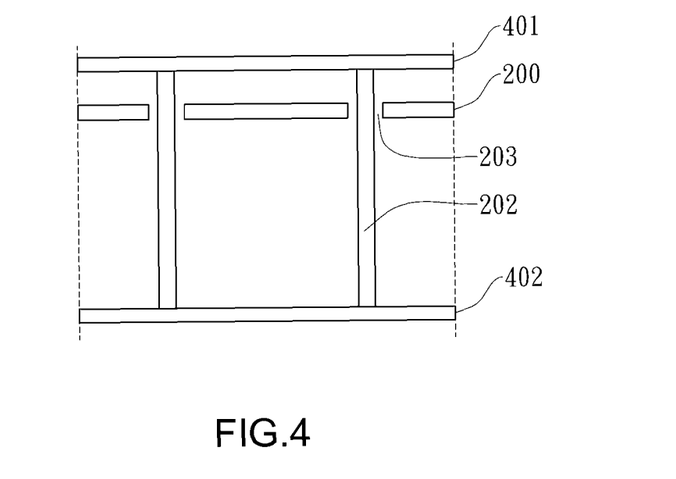
FIG. 4 is a cross-sectional diagram of the first embodiment of the embedded circuit board according to the present invention.

Please refer to both FIG. 3 and FIG. 4. FIG. 3 is an enlarged diagram of the periodical cell 201, and FIG. 4 is a cross-sectional diagram of the first embodiment of the embedded circuit board according to the present invention. As shown in the figures, the distance between the upper ground layer 401 and the power layer 200 is h1, and the distance between the lower ground layer 402 and the power layer 200 is h2. Each via 202 is electrically connected with the upper ground layer 401 and the lower ground layer 402, and the distance between centers of each via is p. Generally, the via 202 is a cylinder with the radius represented as r. Each via 202 and the power layer 200 are spaced apart from each other by a clearance 203, so as to electrically isolate the vias 202 and the power layer 200. The clearance 203 may be an air gap or filled with an isolating material. The distance from the center of the via 202 to the edge of the metal plate 204 is c. The closest distance from the center of the via 202 to the edge of the cell 201 is d.

The metal plate 204 and the ground layers 401, 402 electrically connected through the vias 202 may form a composite equivalent capacitor. Besides, the adjacent metal plates 204 may be equivalent to a capacitor, and the bridge 205 may be equivalent to an inductance effect. Thus, a stop band of broadband may be achieved by employing the above-mentioned equivalent capacitor and inductance effect connected in parallel. Now that it is not easy for the signals within the stop band to broadcast outward, the purpose for suppressing noise interference is achieved, and the electromagnetic radiation of the stop band can also be effectively suppressed.

In order to further describe the advantage of the present invention, a model will be established to illustrate the preferred configuration of the vias. Generally, because the height of each substrate of the multi-layer circuit board is relatively very small in comparison with its length and width, there is no field variation in Z direction. Also, because the mode of the electric field must meet the condition that the amount of the tangent electric field is zero on the ground plate, only $TM_Z$ mode exists. Since the cutoff frequency of the electromagnetic mode between ground plates is equal to the resonance frequency with the boundary condition by placing perfect magnetic conductors on the periphery of a single cell, the issue for a preferred configuration of the vias may be simplified as obtaining the resonance frequency with the boundary condition by placing perfect magnetic conductors on the periphery of a single cell.

Figure 5A:
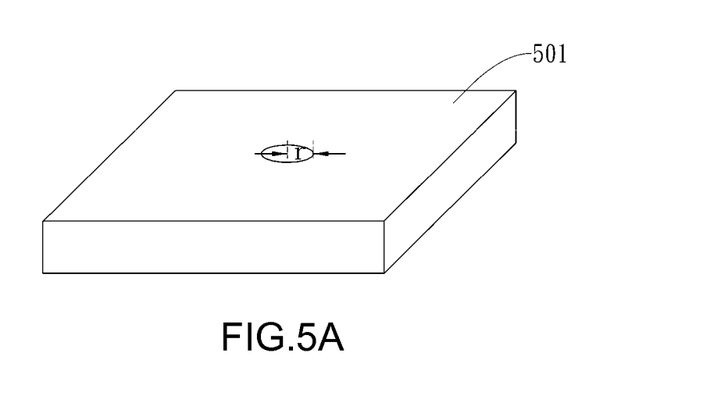
FIG. 5 is a model of the hollow ground plate, the via and the solid ground plate.
Figure 5B:
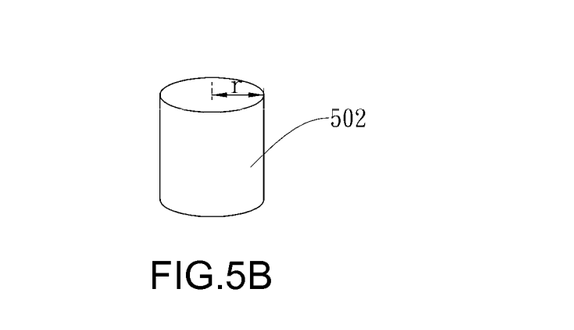

Please refer to FIG. 5A and FIG. 5B. In order to further simplify the issue, the structure is divided into two sub-structures. The first sub-structure is a hollow ground plate 501 having a hollow cylindrical space, and the input impedance of the hollow ground plate 501 is determined as $Z_L$. The second sub-structure is a via 502, and its shape and size are the same as those of the hollow cylindrical space, and the input impedance of the via 502 is determined as $Z_R$. The interface of the two sub-structures is determined as the terminal. Since the mode of the two sub-structures must satisfy the boundary condition at the interface, the relation between $Z_L$ and $Z_R$ may be represented as below.

$$Z_L(\omega) = Z_R(\omega)^* \tag{1}$$

Because the tangent electric field of the perfect electric conductor is zero, $Z_R$ equals zero, and (1) may be rewritten as below.

$$Z_L(\omega) = 0 \tag{2}$$

Figure 5C:
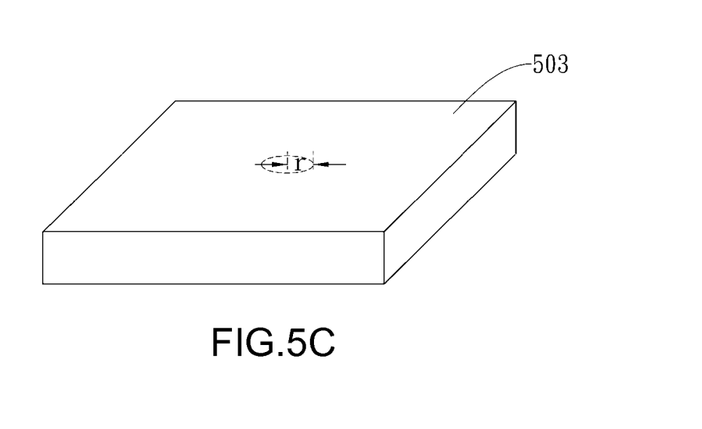

Furthermore, it is assumed that a solid ground plate 503 shown in FIG. 5C will be formed by combining the hollow ground plate 501 with a cylindrical ground plate of the same size as the hollow cylindrical space. The impedance of the solid ground plate 503 is equal to the parallel impedance of the hollow ground plate 501 and the cylindrical ground plate. However, the impedance of the cylindrical ground plate is usually very large, so that the input impedance of the solid ground plate 503 may be used in a similar manner to the impedance of the hollow ground plate 501. The input impedance of the solid ground plate 503 may be obtained by expanding eigenfunctions in Green function, which is first to write Helmholz equation as below, $$\left(\frac{d^2}{dx^2} + \frac{d^2}{dy^2} + k^2\right) G(x, y; x', y') = -\delta(x-x')\delta(y-y') \tag{3}$$

wherein (x, y) is the position of an observation point, and (x', y') is the position of a signal source. The expansion of eigenfunctions in Green function may be represented as below, $$G(x, y; x', y') = \tag{4}$$

$$\sum_{m=0}^{\infty} \sum_{n=0}^{\infty} \frac{\varepsilon_m^2 \varepsilon_n^2}{(k_{mn}^2 - k^2)a^2} \cos\left(\frac{m\pi x}{a}\right)\cos\left(\frac{n\pi y}{a}\right)\cos\left(\frac{m\pi x'}{a}\right)\cos\left(\frac{n\pi y'}{a}\right)$$

wherein $\alpha$ is the interval between vias or the length of the cell, and $\in_i$ is defined as below, $$\varepsilon_i = \begin{cases} 1, & i = 0 \\ \sqrt{2}, & i = 1, 2, \ldots, \infty \end{cases} \text{wherein } i \text{ is } m \text{ or } n \tag{5}$$

eigenvalues of eigenfunctions is represented as below.

$$k_{mn} = \sqrt{\left(\frac{m\pi}{a}\right)^2 + \left(\frac{n\pi}{a}\right)^2} \tag{6}$$

When the terminal is activated by uniform current density, the average voltage V at the terminal may be represented as below.

$$V = \frac{\iint j\omega\mu h J_Z G(x, y; x', y') dl' dl}{2\pi r} \tag{7}$$

wherein h is the thickness of the ground plate, r is the radius of the via. By introducing (4) into (7), the average voltage V may be rewritten as below.

$$V = \sum_{m=0}^{\infty} \sum_{n=0}^{\infty} \frac{j\omega\mu h J_Z \varepsilon_m^2 \varepsilon_n^2}{2\pi r(k_{mn}^2 - k^2)a^2} \left(\int_0^{2\pi} \cos\left(\frac{m\pi(r\cos\theta + a/2)}{a}\right) \right. \tag{8}$$

$$\cos\left(\frac{n\pi(r\sin\theta + a/2)}{a}\right) rd\theta \right) \cdot$$

$$\left(\int_0^{2\pi} \cos\left(\frac{m\pi(r\cos\theta' + a/2)}{a}\right)\cos\left(\frac{n\pi(r\sin\theta' + a/2)}{a}\right) rd\theta'\right)$$

By introducing (5) into (8) and simplifying the equation, the average voltage V may be rewritten as below.

$$V = \frac{j\omega\mu r h J_Z}{2\pi a^2} \left( \frac{(2\pi)^2}{-k^2} + \sum_{m=1}^{\infty} \frac{4\left(\int_0^{2\pi} \cos\left(\frac{m\pi r\cos\theta}{a}\right)\cos\left(\frac{m\pi}{2}\right)d\theta\right)^2}{k_{m0}^2 - k} + \right. \tag{9}$$

$$\left. \sum_{m=1}^{\infty}\sum_{n=1}^{\infty} \frac{4\left(\int_0^{2\pi} \cos\left(\frac{m\pi r\cos\theta}{a}\right)\cos\left(\frac{m\pi}{2}\right)\cos\left(\frac{n\pi r\sin\theta}{a}\right)\cos\left(\frac{n\pi}{2}\right)d\theta\right)^2}{(k_{mn}^2 - k^2)} \right)$$

By introducing (6) and m=2m' and n=2n' into (9), the average voltage V may be rewritten as below.

$$V = \frac{j\omega\mu r h J_Z}{2\pi a^2} \left( \frac{(2\pi)^2}{-k^2} + \sum_{m'=1}^{\infty} \frac{4\left(\int_0^{2\pi} \cos\left(\frac{2m'\pi r \cos\theta}{a}\right) d\theta\right)^2}{\left(\frac{2m'\pi}{a}\right)^2 - k^2} + \right.$$

$$\left. \sum_{m'=1}^{\infty} \sum_{n'=1}^{\infty} \frac{4\left(\int_0^{2\pi} \cos\left(\frac{2m'\pi r \cos\theta}{a}\right)\cos\left(\frac{2n'\pi r \sin\theta}{a}\right) d\theta\right)^2}{\left(\frac{2m'\pi}{a}\right)^2 + \left(\frac{2n'\pi}{a}\right)^2 - k^2} \right) \quad (10)$$

The total current at the terminal may be represented as below.

$$I = J_Z 2\pi r \quad (11)$$

By introducing (10) and (11) into (2), the eigenvalue equation may be represented as below.

$$Z = \frac{V}{I} = \frac{j\omega\mu h}{(2\pi)^2 a^2} \left( \frac{(2\pi)^2}{-k^2} + \sum_{m'=1}^{\infty} \frac{4\left(\int_0^{2\pi} \cos\left(\frac{2m'\pi r \cos\theta}{a}\right) d\theta\right)^2}{\left(\frac{2m'\pi}{a}\right)^2 - k^2} + \right.$$

$$\left. \sum_{m'=1}^{\infty} \sum_{n'=1}^{\infty} \frac{4\left(\int_0^{2\pi} \cos\left(\frac{2m'\pi r \cos\theta}{a}\right)\cos\left(\frac{2n'\pi r \sin\theta}{a}\right) d\theta\right)^2}{\left(\frac{2m'\pi}{a}\right)^2 + \left(\frac{2n'\pi}{a}\right)^2 - k^2} \right) = 0 \quad (12)$$

Since the scaling feature of Maxwell's equation and the ground plate is for a single medium, if the cutoff frequency is normalized by the length of the cell and the square root of the dielectric constant of the substrate, the normalized cutoff frequency will be determined only by the ratio of the radius of the via to the length of the cell. Because the resonance frequency of the ground plate for the cell without vias is also a function of the length of the cell and the square root of the dielectric constant of the substrate, the cutoff frequency of the ground plate for the cell with vias may be normalized with the resonance frequency of the ground plate for the cell without vias, and the cutoff frequency may be represented as below.

$$f_c = f_n\left(\frac{r}{a}\right) \times \frac{v_c}{2a\sqrt{\varepsilon_r}} \quad (13)$$

wherein $f_n(r/a)$ is the normalized cutoff frequency. By introducing (13) into (12) and simplifying the equation, the eigenvalue equation may be rewritten as below.

$$\frac{(2\pi)^2}{-\pi^2(f_n)^2} + \sum_{m'=1}^{\infty} \frac{4\left(\int_0^{2\pi} \cos\left(2m'\pi \cos\theta\left(\frac{r}{a}\right)\right) d\theta\right)^2}{(2m'\pi)^2 - \pi^2(f_n)^2} + $$

$$\sum_{m'=1}^{\infty} \sum_{n'=1}^{\infty} \frac{4\left(\int_0^{2\pi} \cos\left(2m'\pi \cos\theta\left(\frac{r}{a}\right)\right)\cos\left(2n'\pi \sin\theta\left(\frac{r}{a}\right)\right) d\theta\right)^2}{(2m'\pi)^2 + (2n'\pi)^2 - \pi^2(f_n)^2} = 0 \quad (14)$$

Figure 6:
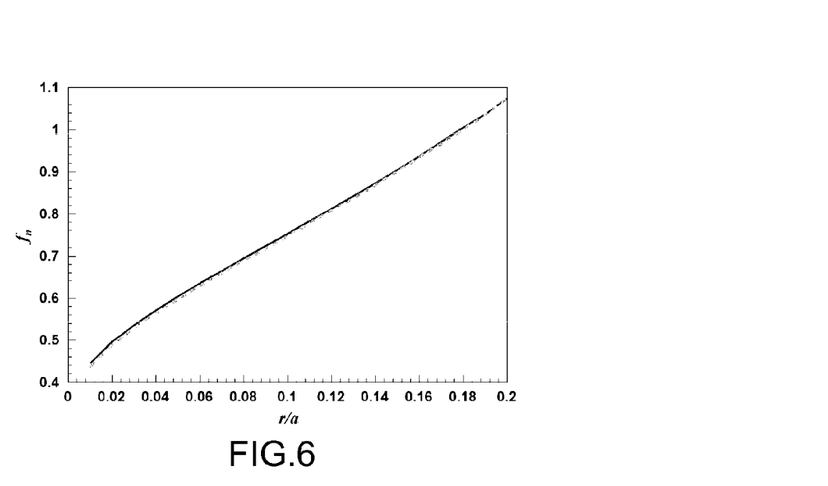
FIG. 6 is a diagram for the comparison between the model analytic solution and the simulation result.
Figure 7:
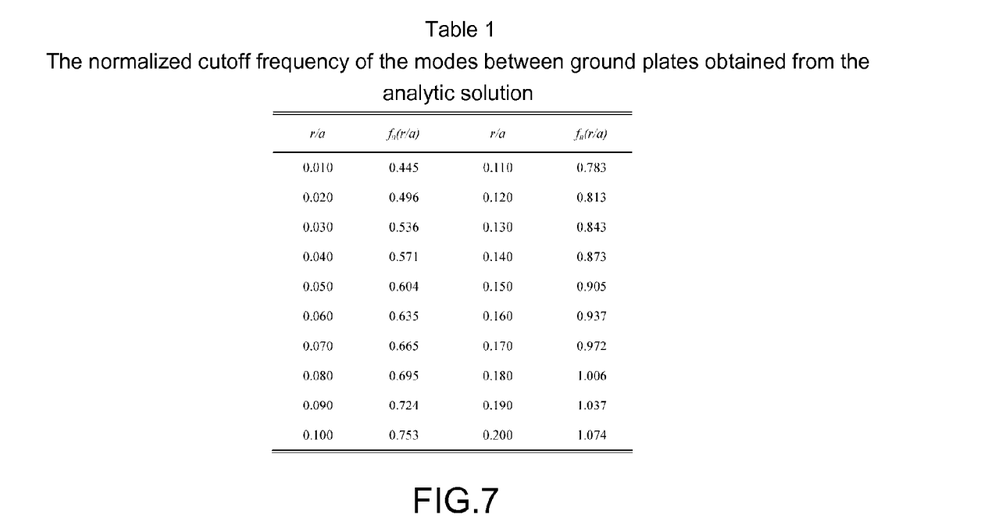
FIG. 7 is a table for the normalized cutoff frequency of the electromagnetic wave modes between ground plates obtained from the analytic solution.

Obviously, in equation (14), only the ratio of the radius of the via to the length of the cell is an independent variable for determining the cutoff frequency of the mode between ground plates. Although (14) is composed of indefinite sequences, the sequences converge very fast. Herein m=n=20 is used as the upper limit of the sequence, and the calculated cutoff frequency is presented in Table 1. In order to verify the correctness of the above analytic solution, the analytic solution is compared with the simulation result obtained by using the simulation software, HFSS, as shown in FIG. 6. It can be clearly seen that the analytic solution (represented in solid line) and the simulation result (represented in dashed line) are consistent with each other. Thus, (13) and Table 1 (as shown in FIG. 7) can be used to evaluate the cutoff frequency caused by the radius of the via and the interval between vias.

Figure 8:
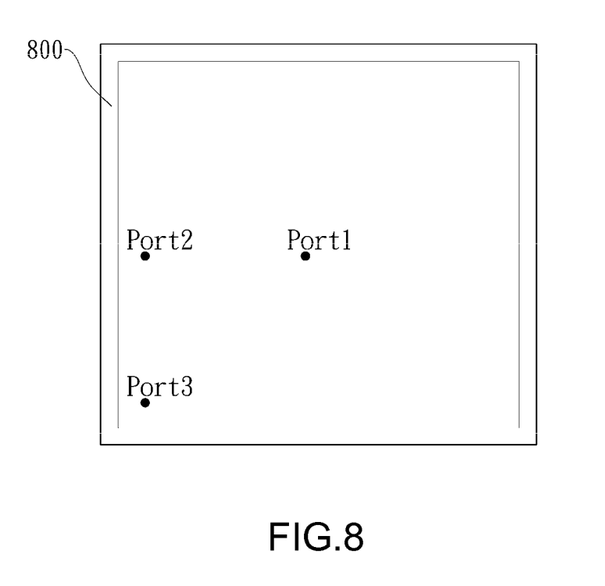
FIG. 8 is a diagram of the reference power layer.
Figure 9:
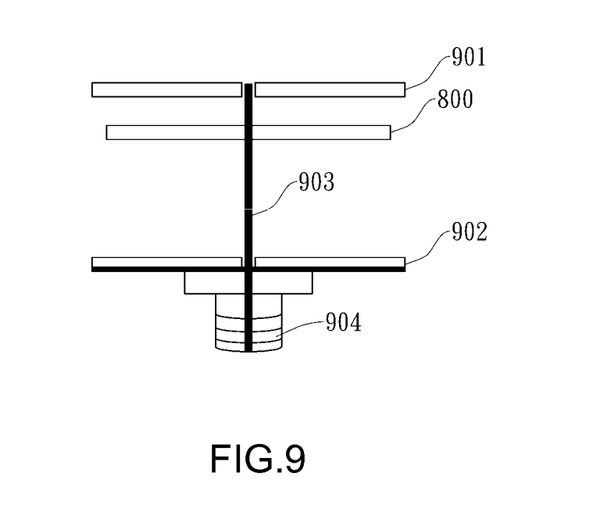
FIG. 9 is a cross-sectional diagram of the measuring port.

In order to further describe the advantage of the embedded multi-layer circuit board according to the present invention, please refer to FIG. 8 and FIG. 9. FIG. 8 is a diagram of a reference power layer 800. FIG. 9 is a cross-sectional diagram of a measuring port. FIG. 8 indicates the positions of Port 1-3 in the reference power layer 800, which are the same as those of Port 1-3 shown in FIG. 2. As shown in FIG. 9, the power layer 800 is located between ground layers 901 and 902. The electrical connection between the probe 903 and the power layer 800 is used as input or output, which forms one port. The output 904 may be electrically connected with the measuring instrument to measure the signal strength at each port. In the embodiment of the specification, each measuring port is connected with the power layer in the configuration shown in FIG. 9.

Figure 10:
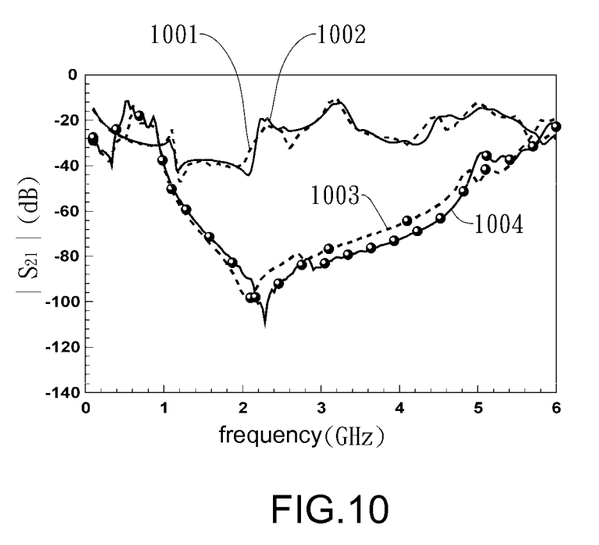
FIG. 10 is a diagram for the comparison between the positive transmission coefficient S21 from Port 1 to Port 2 in the power layer of the first embodiment according to the present invention and the positive transmission coefficient S21 from Port 1 to Port 2 in the reference power layer.

Please refer to FIG. 10, which is a diagram for the comparison between the positive transmission coefficient S21 from Port 1 to Port 2 in the power layer 200 and the positive transmission coefficient S21 from Port 1 to Port 2 in the reference power layer 800. The curves 1001 and 1003 are the simulation results obtained by respectively simulating the positive transmission coefficient S21 from Port 1 to Port 2 in both of the reference power layer 800 and the power layer 200 with the use of the simulation software, HFSS. The curves 1002 and 1004 represent the positive transmission coefficient S21 from Port 1 to Port 2 in the reference power layer 800 and the power layer 200 after the actual measurement. It can be seen in FIG. 10 that the positive transmission coefficient of the power layer 200 of the embedded multi-layer circuit board according to the present invention is less than that of the power layer 800 without applying the present invention.

Figure 11:
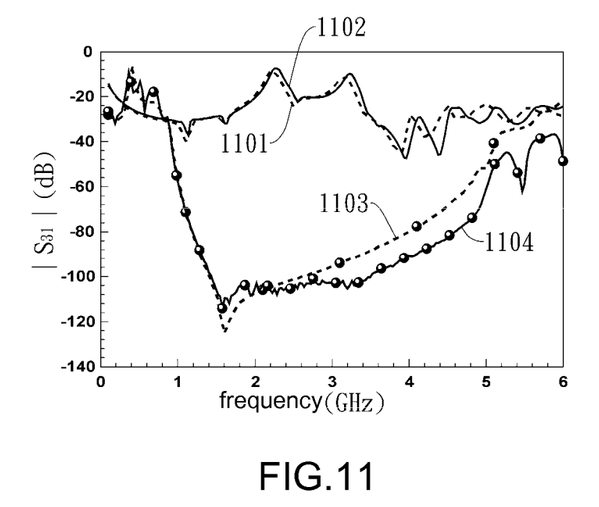
FIG. 11 is a diagram for the comparison between the positive transmission coefficient S31 from Port 1 to Port 3 in the power layer of the first embodiment according to the present invention and the positive transmission coefficient S31 from Port 1 to Port 3 in the reference power layer.

Please refer to FIG. 11, which is a diagram for the comparison between the positive transmission coefficient S31 from Port 1 to Port 3 in the power layer 200 and the positive transmission coefficient S31 from Port 1 to Port 3 in the reference power layer 800. The curves 1101 and 1103 are the simulation results obtained by respectively simulating the positive transmission coefficient S31 from Port 1 to Port 3 in both of the reference power layer 800 and the power layer 200 with the use of the simulation software, HFSS. The curves 1102 and 1104 represent the positive transmission coefficient S31 from Port 1 to Port 3 in the reference power layer 800 and the power layer 200 after the actual measurement. It can be seen in FIG. 11 that the positive transmission coefficient of the power layer 200 of the embedded multi-layer circuit board according to the present invention is less than that of the power layer 800 without applying the present invention.

Figure 12:
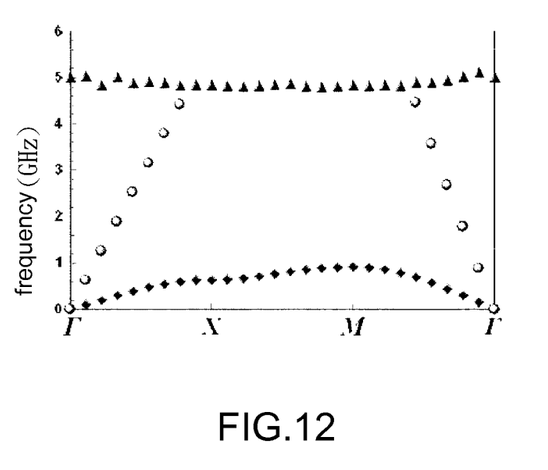
FIG. 12 is a diagram of the dispersion of the first embodiment according to the present invention.
Figure 13:
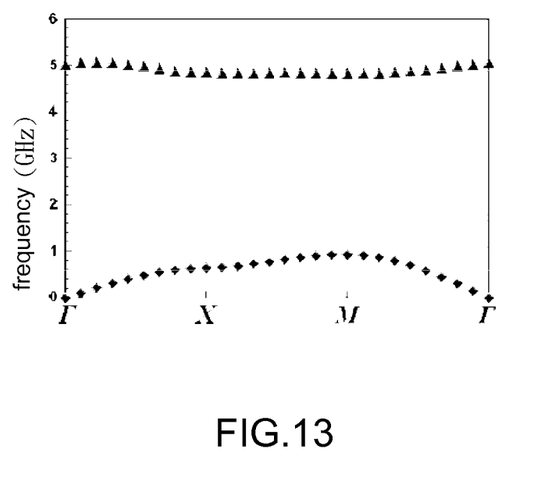
FIG. 13 is a diagram of the dispersion of a multi-layer circuit board without a via structure.

Please refer to both FIG. 12 and FIG. 13. FIG. 12 is a diagram illustrating the dispersion of the embodiment shown in FIG. 2. FIG. 13 is a diagram of the dispersion of a multi-layer circuit board without a via structure but with a periodical metal plate. The triangular line and the diamond line represent the transmission modes between the power layer and the ground layer, and the dot line represents the transmission mode between the ground layers. The parameters of the embodiment in FIG. 12 are shown as follows: h1=0.1 mm, h2=0.5 mm, p=6.3 mm, r=0.15 mm, c=0.45 mm, d=3.15 mm. Comparing with both figures, it will be apparent that the noise transmission mode between ground layers in FIG. 12 has been increased, and the cutoff frequency for the noise transmission mode between ground layers is larger than 4.8 GHz. It will be appreciated from the above description that there is a bandwidth for noise suppression between the power layer and the ground layer in the embedded multi-layer circuit board according to the present invention, and there is a bandwidth for noise suppression between the two ground layers. As shown in FIG. 12, the bandwidths range from 0.931 GHz to 4.828 GHz.

Figure 14:
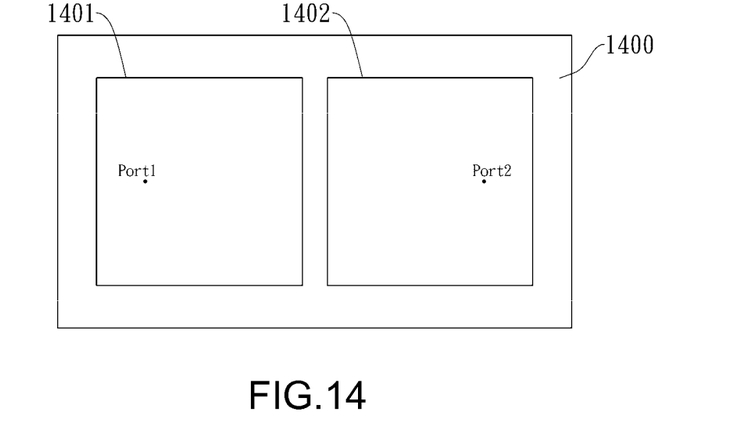
FIG. 14 is a diagram of a reference power layer without a via structure.
Figure 15:
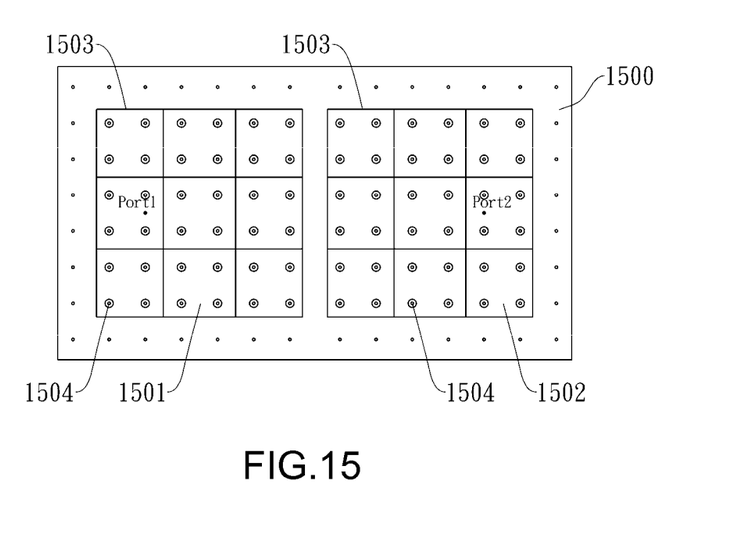
FIG. 15 is a diagram of the second embodiment of the embedded multi-layer circuit board according to the present invention.
Figure 16:
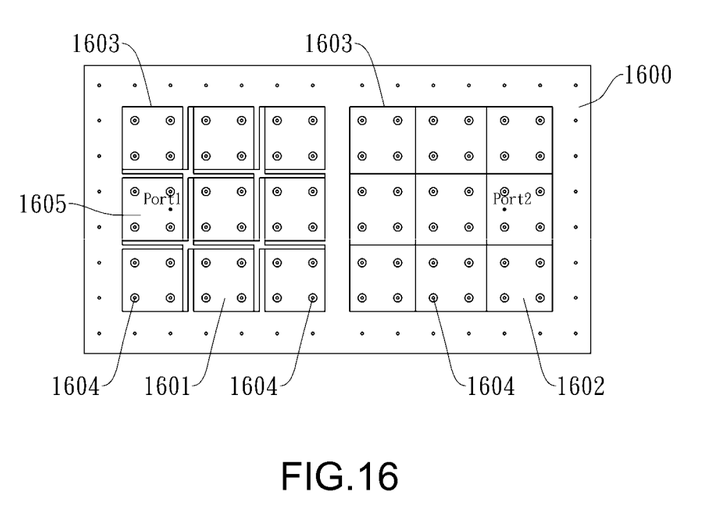
FIG. 16 is a diagram of the third embodiment of the embedded multi-layer circuit board according to the present invention.

Please also refer to FIG. 14 to FIG. 16. FIG. 14 is a diagram of a reference power layer without a via structure. FIG. 15 is a diagram of the second embodiment of the embedded multi-layer circuit board according to the present invention. FIG. 16 is a diagram of the third embodiment of the embedded multi-layer circuit board according to the present invention. As shown in these figures, the power layers 1400, 1500 and 1600 have two power plates. The power layer 1400 has a left power plate 1401 and a right power plate 1402. The power layer 1500 has a left power plate 1501 and a right power plate 1502. The power layer 1600 has a left power plate 1601 and a right power plate 1602. The left and right power plates are electrically isolated from each other, and individually connected with different voltage potentials.

As shown in FIG. 15, the left power plate 1501 and the right power plate 1502 respectively comprise a plurality of periodical cells 1503, and each periodical cell 1503 has the same number of the vias 1504.

As shown in FIG. 16, the left power plate 1601 comprises a plurality of metal plates 1605, and each periodical cell 1603 has the same number of the vias 1604. Each metal plate 1605 is electrically connected with each other, and individually corresponds to the periodical cell 1603.

Figure 17:
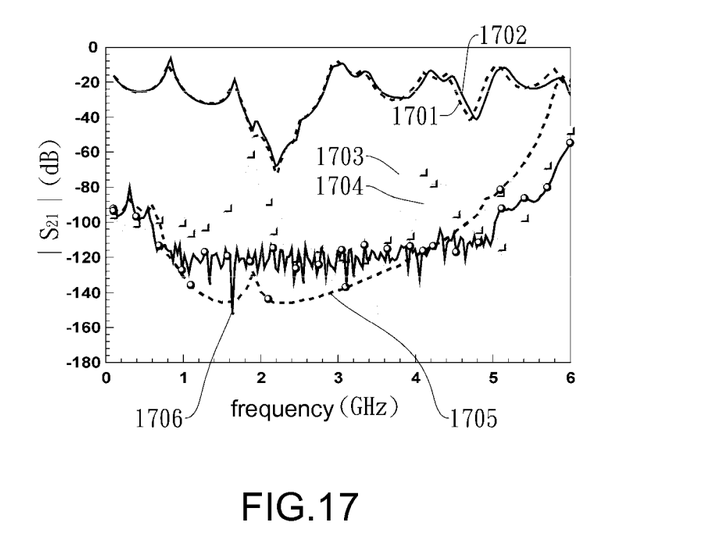
FIG. 17 is a comparison diagram for the positive transmission coefficient S21 from Port 1 to Port 2 in the reference power layer, the positive transmission coefficient S21 from Port 1 to Port 2 in the power layer of the second embodiment, and the positive transmission coefficient S21 from Port 1 to Port 2 in the power layer of the third embodiment.

Please also refer to FIG. 17, which is a comparison diagram for the positive transmission coefficient S21 from Port 1 to Port 2 in the reference power layer 1400, the positive transmission coefficient S21 from Port 1 to Port 2 in the power layer 1500, and the positive transmission coefficient S21 from Port 1 to Port 2 in the power layer 1600. The curves 1701, 1703 and 1705 are the simulation results obtained by respectively simulating the positive transmission coefficient S21 from Port 1 to Port 2 in the reference power layer 1400, the power layer 1500 and the power layer 1600 with the use of the simulation software, HFSS. The curves 1702, 1704 and 1706 represent the positive transmission coefficients S21 from Port 1 to Port 2 in the reference power layer 1400, the power layer 1500 and the power layer 1600 after the actual measurement. It can be seen in FIG. 17 that the positive transmission coefficients in the power layers 1500 and 1600 of the embedded multi-layer circuit board according to the present invention are less than the positive transmission coefficient in the reference power layer 1400 without applying the present invention. It will be apparent that there is a bandwidth for noise suppression between the power layer and the ground layer of the embedded circuit board in these embodiments, and there is a bandwidth for noise suppression between the two ground layers.

Figure 18:
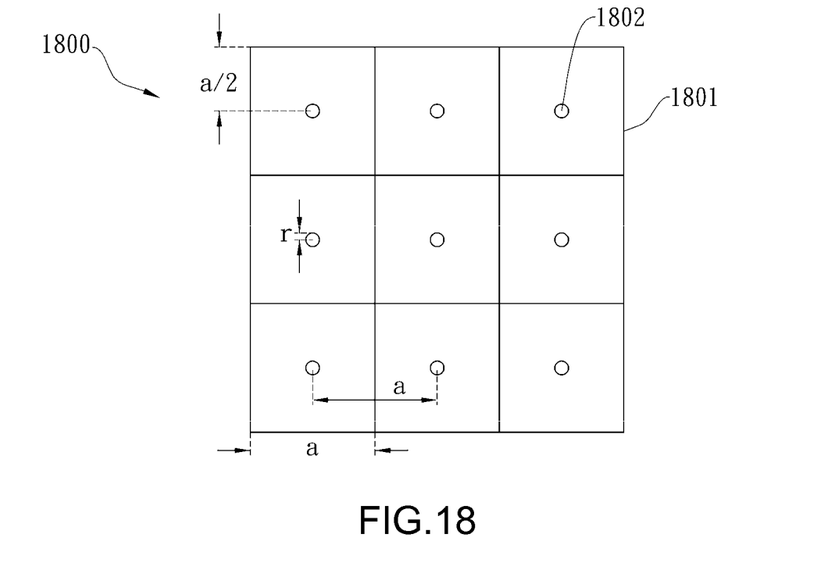
FIG. 18 is a diagram for a configuration of the vias according to the present invention.
Figure 19:
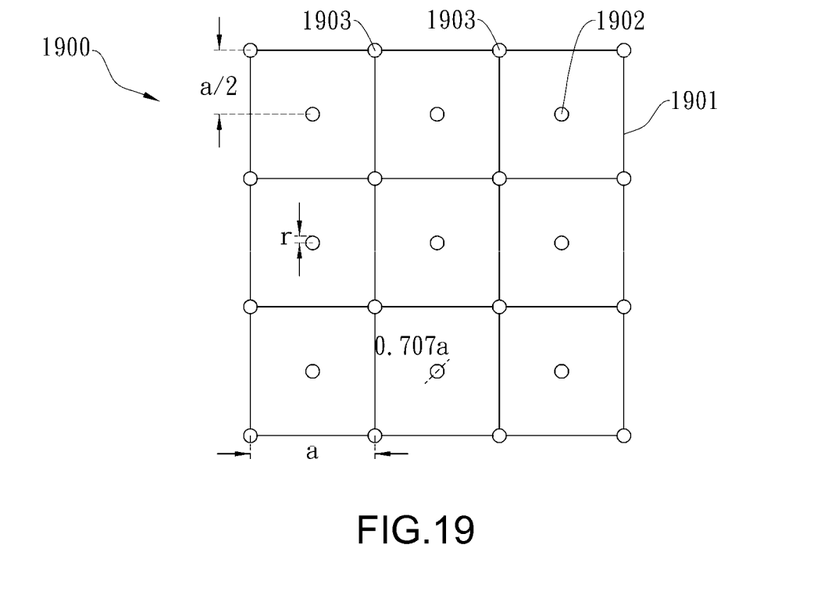
FIG. 19 is a diagram for another configuration of the vias according to the present invention.
Figure 20:
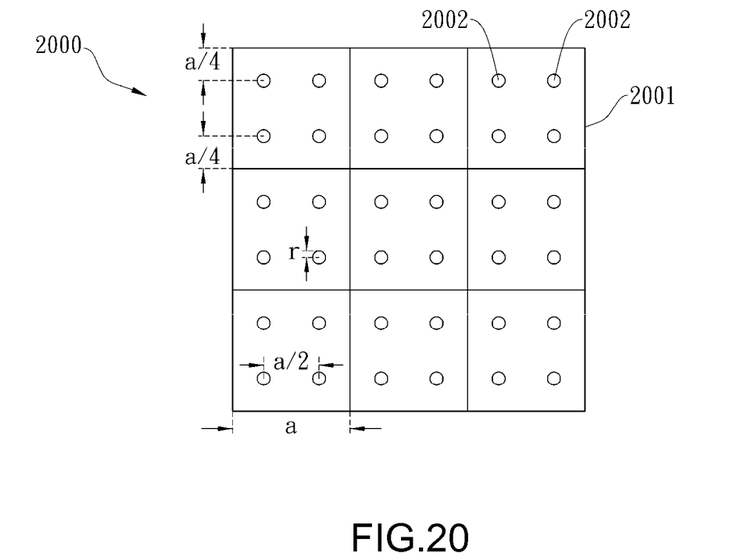
FIG. 20 is a diagram of the configuration of the vias in the first embodiment according to the present invention.

As shown in FIG. 2 and FIG. 20, FIG. 20 is a diagram of the configuration of the vias corresponding to that of the embodiment in FIG. 2 according to the present invention. The power layer 2000 comprises a plurality of square periodical cells 2001, and each periodical cell 2001 has four vias 2002 that form a square arrangement. The radius of each via 2002 is r, and the interval of each via 2002 is a/2. The shortest perpendicular distance of each via 2002 to the edge of the periodical cell 2001 is a/4. Although the present invention discloses an embodiment in which a single periodical cell has four vias, the configuration with different numbers of the vias is also applicable to the present invention. Please refer to FIG. 18, which is a diagram for a configuration of the vias according to the present invention. The power layer 1800 comprises a plurality of square periodical cells 1801, and each periodical cell 1801 has one via 1802. The radius of each via 1802 is r, and said via is located in the center of periodical cell 1801. Besides, please refer to FIG. 19, which is a diagram for another configuration of the vias according to the present invention. The power layer 1900 comprises a plurality of square periodical cells 1901. The central via 1902 is located in the center of the periodical cell 1901, while the corner vias 1903 are located at the four corners of the periodical cell 1901. Thus, each periodical cell 1901 comprises one fourth of each corner via 1903. That is, each periodical cell 1901 includes two vias in total. Generally, the number of the vias in each periodical cell does not exceed four.

As described above, the configuration of the vias in the embedded multi-layer circuit board according to the present invention is not limited to the aforesaid configurations. Preferably, each square profile has at least one via located in the center of the square profile.

In an embodiment according to the present invention, the sums of areas occupied by the vias in each periodical cell on the power layer are equal.

In an embodiment according to the present invention, each square profile has at least two vias, and one of the vias is located in the center of the square profile, and the equivalent portions of the other vias are distributed radially and symmetrically with respect to the center of the square profile.

In an embodiment according to the present invention, each square profile has four vias that are distributed radially and symmetrically with respect to the center of the square profile.

It will be apparent from the above description that the present invention is innovative, progressive and industrially practicable. The present invention has been disclosed in the context with preferred embodiments, but these embodiments cannot be construed as limitation to the present invention. The skilled in the art may make variations and modifications without departing from the spirit and scope of the present invention.

We claim:

1. An embedded multi-layer circuit board, which comprises:
   at least two ground layers and one power layer, the power layer is located between the two ground layers; and
   a plurality of vias, each via is electrically connected with the two ground layers, and each via is electrically isolated from the power layer;
   wherein the power layer is divided into a plurality of cells arranged periodically, and comprises a plurality of metal plates interconnected by a plurality of bridges and each cell has the same number of the vias;
   wherein the metal plate and the two ground layers electrically connected through the vias form a composite equivalent capacitor, the adjacent metal plates form a capacitor, and each of the bridges forms an inductor; and
   wherein a stop band is achieved by employing the composite equivalent capacitor, the capacitor and the inductor connected in parallel.

2. The embedded multi-layer circuit board according to claim 1, further comprises at least one circuit layer.

3. The embedded multi-layer circuit board according to claim 1, wherein the sums of areas occupied by the vias in each cell on the power layer are equal.

4. The embedded multi-layer circuit board according to claim 1, wherein each cell has a rectangular profile.

5. The embedded multi-layer circuit board according to claim 1, wherein the power layer comprises a plurality of metal plates, and each metal plate is electrically connected with each other, and individually corresponds to one cell.

6. The embedded multi-layer circuit board according to claim 5, wherein the metal plate is electrically isolated from the vias.

7. The embedded multi-layer circuit board according to claim 1, wherein the power layer comprises a plurality of metal plates, and each metal plate is electrically connected with each other, and has the same profile.

8. The embedded multi-layer circuit board according to claim 7, wherein the metal plate is electrically isolated from the vias.

9. The embedded multi-layer circuit board according to claim 1, wherein there is a bandwidth for noise suppression between the power layer and the ground layer.

10. The embedded multi-layer circuit board according to claim 1, wherein there is a bandwidth for noise suppression between the two ground layers.

11. The embedded multi-layer circuit board according to claim 1, wherein the number of the vias in each periodical cell does not exceed four.

12. The embedded multi-layer circuit board according to claim 1, wherein each cell has a square profile.

13. The embedded multi-layer circuit board according to claim 12, wherein at least one via in each square profile is located in the center of the square profile.

14. The embedded multi-layer circuit board according to claim 12, wherein each square profile has one via, and the via is located in the center of the square profile.

15. The embedded multi-layer circuit board according to claim 12, wherein each square profile has at least two vias, and one of the vias is located in the center of the square profile, and the equivalent portions of the other vias are distributed radially and symmetrically with respect to the center of the square profile.

16. The embedded multi-layer circuit board according to claim 12, wherein each square profile has four vias, and the four vias are distributed radially and symmetrically with respect to the center of the square profile.

17. The embedded multi-layer circuit board according to claim 1, wherein the power layer comprises a first power plate and a second power plate, and the first power plate and the second power plate are electrically isolated from each other.

18. The embedded multi-layer circuit board according to claim 17, wherein the first power plate and the second power plate are individually used to be connected with different voltage potentials.

19. The embedded multi-layer circuit board according to claim 17, wherein the first power plate comprises a plurality of metal plates, and each metal plate is electrically connected with each other, and individually corresponds to one periodical cell.

* * * * *